(12) United States Patent
Kraut et al.

(10) Patent No.: US 7,428,407 B2
(45) Date of Patent: Sep. 23, 2008

(54) AMPLITUDE MODULATOR, IN PARTICULAR FOR MOBILE RADIO, AND A METHOD FOR MODULATION OF A SIGNAL

(75) Inventors: Gunther Kraut, Egmating (DE); Bernd Adler, Neubiberg (DE); Grigory Itkin, München (DE)

(73) Assignee: Infineon Technologies AG, Munich (DE)

( * ) Notice: Subject to any disclaimer, the term of this patent is extended or adjusted under 35 U.S.C. 154(b) by 441 days.

(21) Appl. No.: 11/198,672

(22) Filed: Aug. 5, 2005

(65) Prior Publication Data
US 2006/0040623 A1 Feb. 23, 2006

(30) Foreign Application Priority Data
Aug. 19, 2004 (DE) .................. 10 2004 040 278

(51) Int. Cl.
*H04B 1/04* (2006.01)
(52) U.S. Cl. .................. 455/108; 455/102; 455/127; 455/126; 327/148
(58) Field of Classification Search ................ 455/108, 455/102, 127, 126; 327/148
See application file for complete search history.

(56) References Cited
U.S. PATENT DOCUMENTS
4,480,230 A * 10/1984 Brehmer et al. ............. 330/255
4,893,091 A * 1/1990 Lillis et al. .................. 330/253
5,175,877 A 12/1992 Streeter
6,256,482 B1 7/2001 Raab
2002/0077066 A1 6/2002 Pehlke et al.
2004/0239384 A1* 12/2004 Cottin et al. ................ 327/148
2006/0040623 A1* 2/2006 Kraut et al. .................. 455/108

FOREIGN PATENT DOCUMENTS
DE 195 35 075 A1 4/1996
EP 1 014 566 A2 6/2000
EP 1 170 915 A1 1/2002

* cited by examiner

*Primary Examiner*—Sanh D Phu
(74) *Attorney, Agent, or Firm*—Eschweiler & Associates, LLC

(57) ABSTRACT

An amplitude modulator is provided, which has a first supply connection for supplying a supply potential and a second supply connection for supplying a ground potential. An amplifier stage with a push-pull output stage has a signal input for supplying a signal, and has a single-pole output for emitting a single-ended signal. In order to supply the push-pull output stage, the amplifier stage is connected in a supply path between the first and the second supply connection. A first controllable voltage source and a second controllable voltage source are also provided, whose control inputs are connected to a connection for control purposes by means of a differential modulation signal, and are connected between the amplifier stage and the first supply connection, or the amplifier stage and the second supply connection. Amplitude modulation is thus achieved by modulation of the supply voltage or of the supply current to the push-pull output stage.

20 Claims, 3 Drawing Sheets

AMPLITUDE MODULATOR, IN PARTICULAR FOR MOBILE RADIO, AND A METHOD FOR MODULATION OF A SIGNAL

REFERENCE TO RELATED APPLICATIONS

This application claims the benefit of the priority date of German application DE 10 2004 040 278.7, filed on Aug. 19, 2004, the contents of which are herein incorporated by reference in their entirety.

FIELD OF THE INVENTION

The invention relates to an amplitude modulator, in particular for mobile radio. The invention also relates to a method for modulation of a signal.

BACKGROUND OF THE INVENTION

Some mobile radio standards require additional amplitude modulation, as well as pure phase modulation and/or frequency modulation, in an upgraded version. The extension to the GSM mobile radio standard, by way of example, thus uses a modulation type which codes information both in the phase and in the amplitude. Examples of a modulation method such as this are the 8-PSK (8 phase shift keying) modulation type, as is used in the GSM-EDGE mobile radio standard. Another example is QPSK modulation methods (quadrature phase shift keying modulation). These are used in the third-generation mobile radio standards. A combination of pure phase modulation and/or frequency modulation with amplitude modulation allows an increase in the transmission speed.

Fundamentally, however, transmitter assemblies for mobile radios have to cope with a number of modulation types, for example pure phase modulation such as the GMSK modulation that is used for the GSM mobile radio standard, as well as combined amplitude and phase modulation, such as 8-PSK for GSM-EDGE.

A polar modulator allows data which is amplitude-modulated or phase-modulated at the same time to be transmitted in a manner which is insensitive to external disturbance influences and can be implemented very efficiently.

Every radio-frequency signal (R(t)) with any form of modulation can be represented in polar coordinate form as follows:

$$R(t)=A(t)*\cos(\omega t+\phi(t))$$

In this case, A(t) represents the amplitude information, which varies over time, $\phi(t)$ represents the phase information, which varies over time. The amplitude A(t) and the phase $\phi(t)$ thus contain the payload information. A polar modulator is designed for modulation of the amplitude and of this phase.

FIG. 4 shows a block diagram of a transmitter for a signal based on a mobile radio standard, with the signal containing the payload information. The transmitter contains a phase locked loop which modulates the required phase information directly onto the radio-frequency signal. The output signal S(t) from the phase locked loop 1 can thus be described by the function $S(t)=f(\omega t+\phi(t))$. In the case of pure phase modulation, this signal is passed directly via a preamplifier 13 and a switch 14 to the output amplifier 15. The output amplifier 15 amplifies the modulated signal to the required level.

In the case of amplitude and phase modulation of the output signal, in contrast, switching takes place to a second transmission path. This is done by switching the switch 14, which connects the input of the power output stage 15, to the output of an amplifier 12. A mixer 11 and a controllable amplifier 12 are activated at the same time. The amplifier 12 is connected on the input side to the output of the mixer 11, which operates as an amplitude modulator and which is supplied with a signal S(t), which is phase-modulated on the input side. After amplitude modulation A(t) of the phase-modulated signal emitted from the phase locked loop 1, this signal is preamplified in a suitable manner by the preamplifier 12, and is supplied to the power output stage.

Thus, in this conventional solution, two different signal paths are provided for the pure phase modulation and combined amplitude and phase modulation. This makes it possible to comply with the possibly different noise and distortion requirements for the various mobile radio standards.

For example, the upper signal path with the amplifier 13 is thus designed for particularly low-noise amplification, but does not provide good linearity for this purpose, since this is of secondary importance for pure phase modulation. In contrast, the lower signal path for combined amplitude and phase modulation may be designed to be less noise-free, but requires a very linear transmission response. Furthermore, for the 8-PSK modulation type, it must be possible to adjust the required output power at the input of the output stage power amplifier 15 over a wide range of about 45 dB. This can be achieved by a variable amplifier 12, whose gain is adjustable and which is connected downstream from the mixer 11, which operates as an amplitude modulator.

However, amplifiers whose gain factor can be varied continuously, so-called VGAs, have the disadvantage that the distortion rises considerably when their gain is reduced, that is to say at low output power levels. This distortion can be reduced only by means of a large bias current through the amplifier, although this makes the efficiency worse and increases the overall power consumption. Furthermore, the space occupied by the two signal paths to be provided is increased, and parasitic effects must be taken into account in the respective signal path which is switched off and is not being used.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a circuit arrangement which is suitable both for pure modulation and for combined amplitude and phase modulation, as well as a method of modulating a signal in a simple manner.

In one embodiment of the invention, an amplitude modulator comprises a first supply connection for supplying a supply potential, and a second supply connection for supplying a ground potential. The amplitude modulator includes an amplifier stage which has a push-pull output stage, and has a signal input for supplying a signal and has a single-pole output for emitting a single-ended signal. The amplifier stage is connected in a supply path between the first and the second supply connection in order to supply the push-pull output stage. The amplitude modulator also comprises a first controllable voltage source as well as a second controllable voltage source, whose control inputs are connected to a connection for control by means of a differential amplitude modulation signal. The first controllable voltage source is connected between the amplifier stage and the first supply connection, and the second controllable voltage source is connected between the amplifier stage and the second supply connection.

Amplitude modulation of a signal supplied to the input side in an amplifier stage which has a push-pull output stage is thus carried out by amplitude modulation of a supply voltage. In other words, the amplitude modulator according to the invention is designed for amplitude modulation of a signal on the input side by modulation of its supply voltage or its supply current. The two controllable voltage sources are preferably voltage-controlled via a push-pull voltage signal.

In one embodiment of the invention, a filter arrangement is connected in the supply path, comprises a low-pass transmission characteristic, and is provided between the controllable voltage source and the amplifier stage. The filter arrangement is used to decouple the low-frequency amplitude modulation from the voltage source from the radio-frequency signal component, which are passed parasitically into the supply path from the push-pull output stage. This reduces distortion, and improves linearity.

In another embodiment of the invention, the input of the amplitude modulator is coupled to a phase modulator in order to supply a phase-modulated signal. In this embodiment, the amplitude modulator and the phase modulator jointly form a polar modulator and can be produced in a simple manner as an integrated circuit in a semiconductor body.

Furthermore, in another embodiment of the invention, the push-pull output stage comprises two series-connected controllable paths, with the controllable paths having an opposite conductance type. One connection of each of the two controllable paths is connected to one another, forming a single-pole output. A control connection of the two controllable paths is coupled to the signal input. The two controllable paths are, in one example, two field-effect transistors of opposite conductance type. A first field-effect transistor is thus of a first conductance type, and a second field-effect transistor of a second conductance type.

In another embodiment of the invention, the controllable voltage sources each comprise an operational amplifier with feedback. A control output of the respective operational amplifier is connected to a control connection of, in each case, one control transistor which is connected in the supply path. The operational amplifier thus controls the control transistor in a suitable manner, and hence controls the voltage drop across the controllable voltage source. Feedback is provided for the operational amplifiers by, in each case, one tap or node between the amplifier stage and the control transistor. This tap is connected to one of two inputs of the respective operational amplifier.

In one embodiment, the respective second input of the operational amplification is connected to the outputs of a differential amplifier in order to supply a differential amplitude modulation signal. The two controllable voltage sources are thus driven by one differential signal.

In a further embodiment, the first control transistor in the first controllable voltage source is of the opposite conductance type to the control transistor in the second controllable voltage source. This is, in one example, of the same conductance type as the controllable path which is coupled to the first control transistor.

With regard to one embodiment of the method, the phase of a signal is initially modulated. The signal is then supplied to an amplifier which amplifies the phase-modulated signal. The amplifier is connected to a supply, and is supplied with a supply voltage and a supply current. The signal is amplitude-modulated by modulating a supply voltage or a supply current to the amplifier. A gain of the amplifier is accordingly changed, thus modulating the amplitude of the signal which is applied to the amplifier.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text using exemplary embodiments and with the assistance of the drawings, in which.

DETAILED DESCRIPTION OF THE INVENTION

Figure 1:
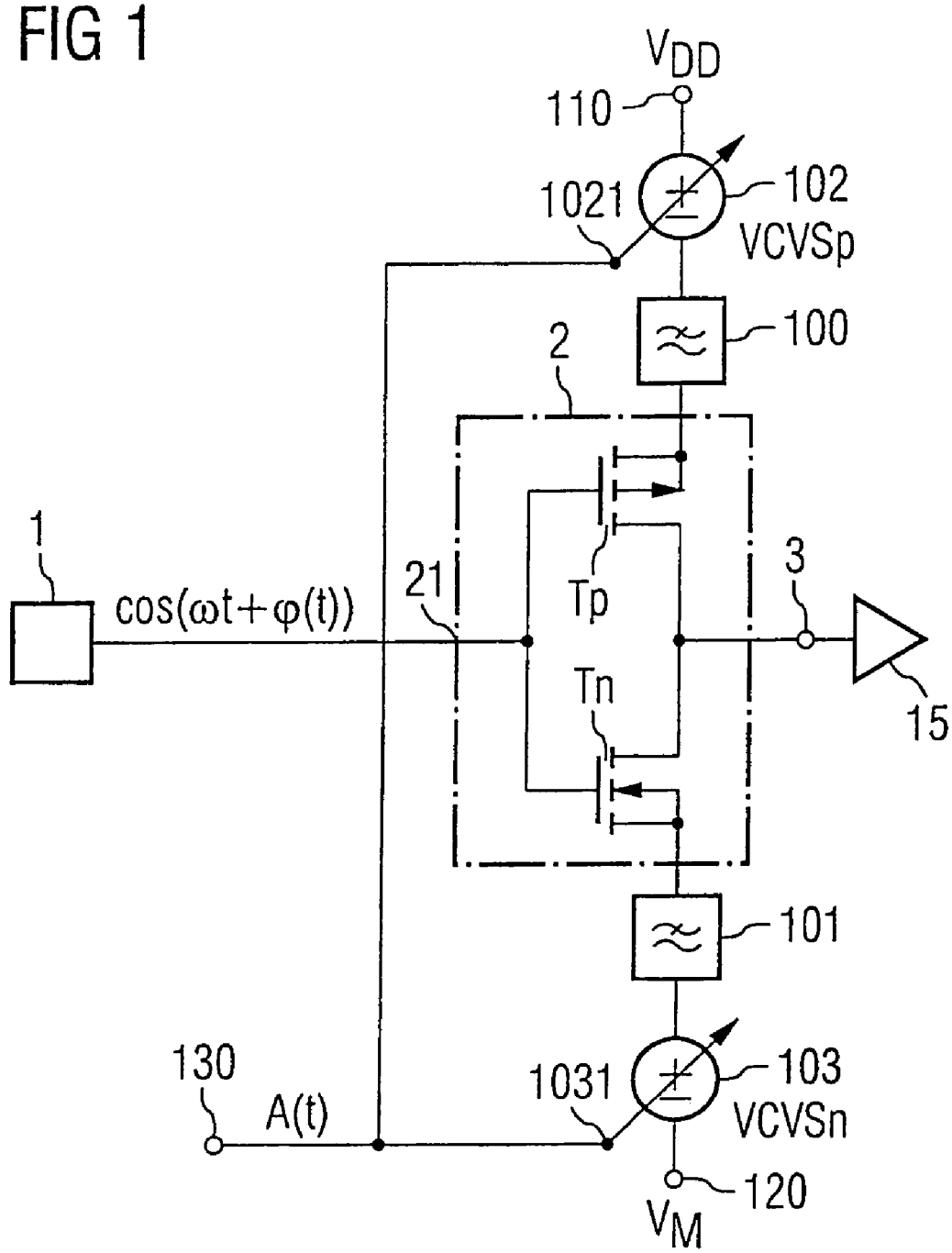
FIG. 1 is a schematic diagram illustrating a first exemplary embodiment of the invention.

FIG. 1 shows a detail of a transmitter as can be implemented in a mobile radio application. The illustrated transmitter is designed to produce phase and amplitude-modulated signals. This makes it possible to implement the types of modulation used in many known mobile radio standards, for example GSM/EDGE, WCDMA, CDMA2000 and 802.11b. The embodiment described here is a polar modulator which modulates the phase $\phi(t)$ of a signal as well as the amplitude $A(t)$ of the signal. For error-free modulation, it is particularly important to ensure accurate time synchronization between the modulated phase and the amplitude. On the other hand, pure phase modulation can be achieved by the present invention by supplying a constant amplitude modulation signal or by fixing the amplitude or by switching off the amplitude modulation. In consequence, the polar modulator that is described here makes it possible in a very simple manner to implement mobile radio standards which use both pure phase modulation and combined amplitude and phase modulation.

The phase modulator 1 produces an output signal which is represented by the function:

$$S(t)=f(\omega t+\phi(t))$$

The angular frequency of the unmodulated radio-frequency signal is $\omega$, and the phase information is superimposed on this by means of modulation $\phi(t)$. This signal is supplied to the amplifier stage for amplitude modulation. For this purpose, the phase modulator 1 is connected to an amplifier stage 2. This amplifier stage is a push-pull output stage with two series-connected field-effect transistors Tp and Tn. The two field-effect transistors are of different conductance types. For example, the transistor Tn is of the n conductance type, while the transistor Tp is of the p conductance type. The conductance type governs the transport through the active channel of the field-effect transistor.

The control connections of the two field-effect transistors Tp and Tn form the input 21 of the amplifier stage and the signal input of the amplitude modulator. A tap between the two field-effect transistors Tp and Tn leads to the output 3 of the amplitude modulator, which is itself coupled to the power amplifier 15.

In order to supply the push-pull output stage 2, the two transistors are connected by in each case one connection to ground or to a reference potential. In particular, the source connection of the transistor Tp is connected to a supply terminal 110 via a first low-pass filter 100 and a controllable voltage source 102. A supply potential VDD can be supplied to this supply connection. In the same way, the second field-effect transistor Tn, of a different conductance type, is connected to the terminal 120 via a low-pass filter 101 and a controllable voltage source 103. The ground potential $V_M$ is applied to this connection. The two voltage sources 102 and 103 are controllable voltage sources, whose control connections 1021 and 1031 are connected to the modulation input 130. The amplitude modulation signal A(t) is supplied to the modulation input 130, and controls the controllable voltage sources 102 and 103 such that the supply voltage and the supply current to the push-pull output stage 2 are changed on the basis of the amplitude modulation signal A(t) that is supplied.

During operation with the constant amplitude modulation signal, the push-pull output stage amplifies a phase-modulated signal that is supplied to the input side, and emits this as a single-ended signal at its single-pole output 3. The amplification is carried out in the push-pull output stage in such a way that each transistor amplifies one half-cycle of the signal which is supplied to the input side. Thus, for example, the field-effect transistor Tn amplifies the positive half-cycle, while the transistor Tp is switched off during this period. The transistor Tn is switched off during a negative half-cycle, and the field-effect transistor Tp amplifies the signal.

A behavior similar to switching can be achieved by suitable choice and configuration of the field-effect transistors Tp and Tn, for example in terms of their geometric dimensions, so that the amplified signal is essentially a square wave. When the drive level is low, the noise in this push-pull output stage 2 is very low in comparison to the conventionally used linear VGA amplifier circuits, by virtue of this type of operation. If a constant amplitude modulation signal A(t)=constant is supplied, the signal modulated by the phase modulator 1 is amplified with a constant gain factor. The amplitude modulator according to the invention can also be used as a preamplifier. The circuit is designed to emit a phase-modulated signal as is used, for example, by the GSM mobile radio standard.

If the amplitude modulation signal A(t) varies over time, the supply voltage to the push-pull output stage will also vary. This also reduces or increases the overall gain of the push-pull output stage 2, thus resulting in amplitude modulation whose modulation level is virtually 100% as a result of the switching behavior of the push-pull output stage, so that the absolute power can be varied in a specified frame of 45 dB with suitable design of the push-pull output stage. This voltage change of 45 dB for phase- and amplitude-modulated signals is required, for example, for GSM/EDGE as well as for WCDMA. Furthermore, a power interval in the region of 45 dB likewise includes the capability to transmit a pulsed signal in a suitable form using a time slot method. This includes, for example, a GSM pulse for the GSM mobile radio standard.

Figure 3:
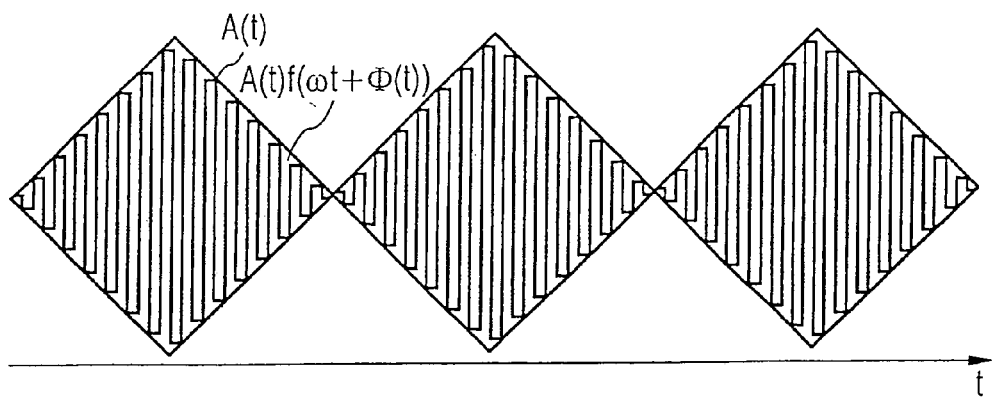
FIG. 3 is a schematic waveform illustration of an amplitude-modulated signal.
Figure 4:
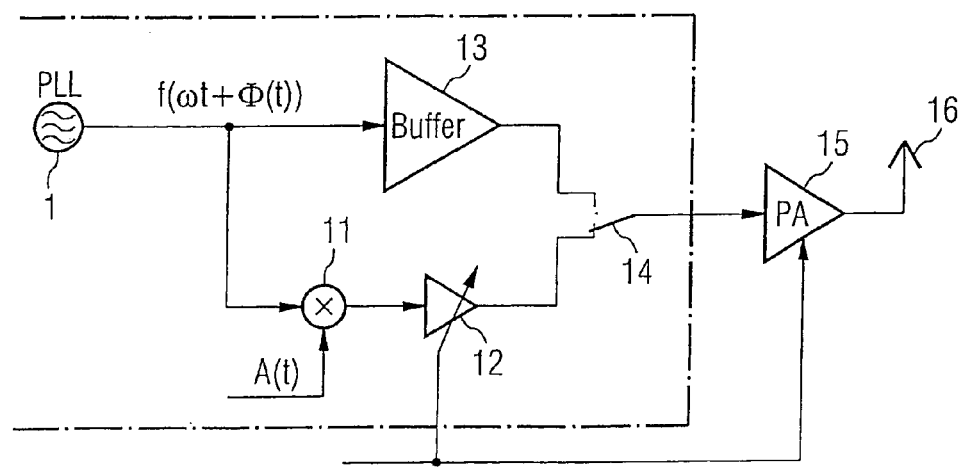
FIG. 4 shows one known embodiment of a polar modulator.

FIG. 3 shows the simulated profile of the output signal at the single-pole or single-ended output 3 of the amplitude modulator as shown in FIG. 1, for a triangular waveform amplitude modulation signal.

Figure 2:
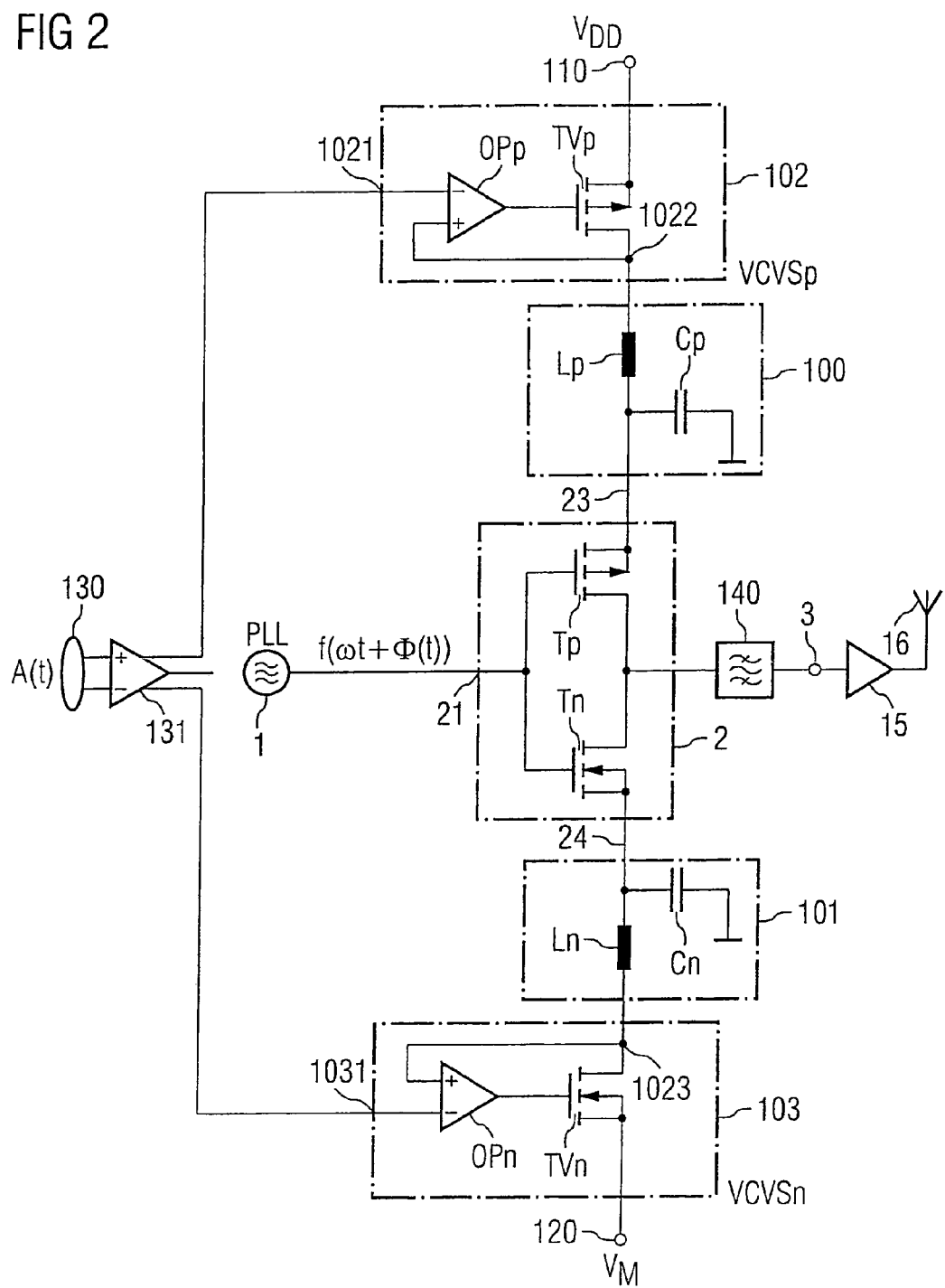
FIG. 2 is a schematic diagram illustrating a second exemplary embodiment of the invention.

A further embodiment of the polar modulator as illustrated in FIG. 1 is shown in FIG. 2. Components with the same function or effect are in this case annotated with the same reference symbols. The filters 100 and 101 which are connected to the connections 23 and 24, respectively, of the push-pull output stage 2 are second-order low-pass filters. The filter 100 contains a coil Lp, which is connected in series between the output 23 and the controllable voltage source 102, as well as a capacitor Cp, which is coupled to the output 23. The second connection of the capacitor Cp is connected to a ground potential. The filter 101 is designed in the same way.

The two filters 100 and 101 decouple radio-frequency components (which are emitted at the outputs 23 and 24 from the push-pull output stage) from the voltage sources 102 and 103. Only the low frequency of the amplitude-modulated supply voltage is not attenuated. This reduces reaction from the signal that is supplied to the input side of the amplitude modulator on the supply circuits, which are not shown here, and reduces distortion. A band pass filter 140 is connected between the push-pull output stage 2 and the output 3 of the amplitude modulator according to one example of the invention. Harmonic signal components which are caused by the switching method of operation of the push-pull output stage are thus adequately suppressed.

In this exemplary embodiment as well, the single-pole output 3 for emitting the single-ended single is connected to the power amplifier 15, with one output of the power amplifier 15 itself being connected to the antenna 16. The topology of the circuit that is used, and, in particular, the single-pole output mean that there is no need for an additional push-pull/single-ended converter or a balun (balanced/unbalanced) converter in the signal path. Provided that suitable impedance matching is provided, as can be produced by the filter 140 as well, the output 3 can thus be directly connected to the signal-ended input of the power output stage 15.

The two controllable voltage sources 102 and 103 in this example each contain an operational amplifier OPp and OPn, respectively. This operational amplifier has an inverting input "−" and a non-inverting input "+". The output of the operational amplifier OPp is passed to a control transistor TVp. The control transistor TVp is in this case of the same conductance type as the transistor Tp in the push-pull output stage 2. Both transistors are coupled to one another via the filter 100. The source connection of the control transistor TVp is connected to the supply potential terminal 110 for supplying the supply potential VDD. The second control transistor TVn, which is of the opposite conductance type to the first control transistor TVn, is also implemented in a similar way.

This is also connected by its control connection to the control output of the operational amplifier OPn in the controllable voltage source 103. The drain connection of the control transistor TVn was connected to the tap 1023 and to the connection of the coil Ln in the filter 101.

The respective non-inverting input "+" of the operational amplifiers OPp and OPn is connected to the respective input 1022 or 1023 in order to form feedback. The two inverting inputs "−" of the operational amplifiers OPp and OPn form the control inputs 1021 and 1031 of the controllable voltage sources 102 and 103, and are connected to the outputs of a differential amplifier 131. The input of the differential amplifier 131 at the same time forms the input 130 for supplying the differential amplitude modulation signal A(t). The two voltage sources 102 and 103 are thus driven via a differential signal.

If, by way of example, the drain voltage of the transistor Tp become more positive as a result of this drive, then the limiting voltage of the transistor Tn becomes more negative to the same extent. The two operational amplifiers OPp and OPn in the two controllable voltage sources have suitable frequency compensation. This also ensures stable operation of the control loop that is provided by the feedback. The high loop gain of the operational amplifiers and control transistors TVp and TVn means that a particularly linear voltage is emitted to the push-pull output stage, thus resulting in a true image of the amplitude information A(t) at the connections of the field-effect transistors Tp and Tn in the push-pull output stage 2. The two filters 100 and 101 produce only slight attenuation, and thus produce hardly any direct-current losses.

The embodiment of an amplitude modulator as described here with a phase modulator 1 connected forms a common polar modulator and can be used in particular for mobile radio applications. In particular, there is no need for any further additional signal path. The amplitude modulator also represents an amplifier for the power output stage 15, in a suitable manner. The use of a push-pull output stage with a single-pole output allows direct connection to a conventional power output stage without any additional conversion measures.

It is, of course, also possible to use bipolar transistors instead of the field-effect transistors used in the exemplary embodiments. It is also likewise possible to interchange the potentials and conductance types of the transistors. Any other desired potential can also be used instead of the ground potential. The push-pull principle results in high output power levels, which are required for operation in particular of non-linear power output amplifiers. At the same time, the stage produces particularly little noise and has a highly linear transmission response.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplitude modulator, comprising:
a first node configured to couple to a supply potential;
a second node configured to couple to a ground potential;
an amplifier stage comprising a push-pull output stage comprising a signal input configured to receive a signal, and a single-pole output configured to output a single-ended output signal from the amplifier stage, wherein the push-pull output stage is coupled in a supply path between the first node and the second node; and
a first controllable voltage source and a second controllable voltage source, each comprising control inputs connected to an amplitude modulation control input configured to receive an amplitude modulation signal, wherein the first controllable voltage source is coupled between the amplifier stage and the first node, and the second controllable voltage source is coupled between the amplifier stage and the second node.

2. The amplitude modulator of claim 1, further comprising a filter arrangement having a low-pass transmission characteristic provided at least between one of the first or second controllable voltage source and the amplifier stage.

3. The amplitude modulator of claim 1, wherein the signal input of the amplifier stage is coupled to an output of a phase modulator, and wherein the signal thereat comprises a phase-modulated signal.

4. The amplitude modulator of claim 1, wherein the push-pull output stage comprises two series-connected controllable paths of opposite conductance type, forming the single-pole output, and wherein each comprise a control connection of the respective controllable paths coupled to the signal input.

5. The amplitude modulator of claim 4, wherein the two controllable paths comprise two field-effect transistors of an opposite conductance type.

6. The amplitude modulator of claim 1, wherein the first and second controllable voltage sources each comprise:
an operational amplifier configured in a negative feedback configuration, wherein each operational amplifier comprises a control output; and
a control transistor connected in the supply path to one of the controllable paths, and comprising a control connection coupled to the control output of the operational amplifier.

7. The amplitude modulator of claim 6, wherein for each controllable voltage source, a node is provided between the amplifier stage and the respective control transistor, thereby providing feedback for the operational amplifiers, and wherein the node is coupled to a first of two inputs of the respective operational amplifiers.

8. The amplitude modulator of claim 6, wherein the first control transistor is of the opposite conductance type to the second control transistor, and is the same as the conductance type of the controllable path which is coupled thereto.

9. The amplitude modulator of claim 6, wherein a respective second input of the operational amplifiers is connected to an output of a differential amplifier and configured to receive an amplitude-modulated difference signal thereat.

10. The amplitude modulator of claim 1, wherein the push-pull output stage comprise bipolar transistors coupled together in an amplifier circuit configuration.

11. A method signal modulation, comprising:
providing a signal to be amplified;
providing a modulated differential signal;
providing an amplifier;
producing a modulated supply voltage and a modulated supply current from the modulated differential signal;
supplying the modulated supply voltage and modulated supply current to the amplifier;
supplying the signal to be amplified to the amplifier; and
amplifying the supplied signal with the amplifier as a function of the modulated supply voltage and the modulated supply current.

12. The method of claim 11, further comprising modifying the phase of the signal over time, such that the phase of the signal is modulated prior to amplifying the supplied signal.

13. An amplitude modulator, comprising:
a push-pull amplifier circuit comprising an input configured to receive an input signal, and an output configured to output an amplitude modulated output signal based on the input signal;
a first controllable voltage source coupled between a first node of the push-pull amplifier circuit and a supply voltage potential, and configured to vary a voltage at the first node as a function of an amplitude modulation signal coupled thereto; and a second controllable voltage source coupled between a second node of the push-pull amplifier circuit and a ground voltage potential, and configured to vary a voltage at the second node as a function of the amplitude modulation signal coupled thereto, wherein the amplitude modulated output signal is amplitude modulated by the push-pull amplifier circuit via a modulation of the voltages at the first and second nodes.

14. The amplitude modulator of claim 13, wherein the push-pull amplifier circuit comprises a CMOS inverter circuit having a supply connection coupled to the first node and a ground connection coupled to the second node.

15. The amplitude modulator of claim 13, further comprising a first low-pass filter coupled between the push-pull amplifier circuit and the first node, and a second low-pass filter coupled between the push-pull amplifier and the second node.

16. The amplitude modulator of claim 13, wherein the first controllable voltage source comprises:

an operational amplifier having a first input coupled to the amplitude modulation signal, a second input coupled to the first node, and an output; and a control transistor comprising a controllable path between the supply voltage potential and the first node, and a control terminal coupled to the output of the operational amplifier, wherein a resistance of the controllable path is a function of the voltages of the amplitude modulation signal and the first node.

17. The amplitude modulator of claim 13, wherein the second controllable voltage source comprises:

an operational amplifier having a first input coupled to the amplitude modulation signal, a second input coupled to the second node, and an output; and a control transistor comprising a controllable path between the supply voltage potential and the second node, and a control terminal coupled to the output of the operational amplifier, wherein a resistance of the controllable path is a function of the voltages of the amplitude modulation signal and the second node.

18. The amplitude modulator of claim 13, further comprising a phase modulator circuit configured to generate a phase modulated signal at an output thereof, and wherein the output of the phase modulator circuit is coupled to the input of the push-pull amplifier circuit.

19. The amplitude modulator of claim 13, further comprising a band-pass filter coupled to the output of the push-pull amplifier circuit.

20. The amplitude modulator of claim 13, further comprising a power amplifier circuit coupled to the output of the push-pull amplifier circuit.

* * * * *